US010494766B2

(12) United States Patent
Richert et al.

(10) Patent No.: US 10,494,766 B2
(45) Date of Patent: Dec. 3, 2019

(54) HIGH GLOSS METAL EFFECT PAPERS

(71) Applicant: BASF SE, Ludwigshafen (DE)

(72) Inventors: Michelle Richert, Illzach (FR);
Thomas Bolle, Efringen-Kirchen (DE);
Roland Fleury, Zwingen (CH)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 15/022,107

(22) PCT Filed: Oct. 1, 2014

(86) PCT No.: PCT/EP2014/071001
§ 371 (c)(1),
(2) Date: Mar. 15, 2016

(87) PCT Pub. No.: WO2015/049262
PCT Pub. Date: Apr. 9, 2015

(65) Prior Publication Data
US 2016/0230339 A1   Aug. 11, 2016

(30) Foreign Application Priority Data

Oct. 4, 2013 (EP) .................. 13187321

(51) Int. Cl.
| D21H 19/16 | (2006.01) |
| C23C 14/22 | (2006.01) |
| D21H 25/04 | (2006.01) |
| D21H 27/26 | (2006.01) |
| D21H 19/06 | (2006.01) |
| D21H 19/08 | (2006.01) |
| D21H 19/20 | (2006.01) |
| D21H 19/82 | (2006.01) |
| D21H 19/22 | (2006.01) |

(52) U.S. Cl.
CPC ............ D21H 19/16 (2013.01); C23C 14/22 (2013.01); D21H 19/06 (2013.01); D21H 19/08 (2013.01); D21H 19/20 (2013.01); D21H 19/82 (2013.01); D21H 25/04 (2013.01); D21H 27/26 (2013.01); D21H 19/22 (2013.01)

(58) Field of Classification Search
CPC .................................................... C23C 14/22
See application file for complete search history.

(56) References Cited

U.S. PATENT DOCUMENTS

| 3,862,333 | A |   | 1/1975 | Chalupa et al. |
| 4,151,175 | A |   | 4/1979 | Crivello et al. |
| 4,165,265 | A | * | 8/1979 | Nakabayashi ......... B05D 3/06 428/458 |
| 4,399,071 | A |   | 8/1983 | Crivello et al. |
| 4,599,275 | A | * | 7/1986 | Hayashi ............... D21H 19/08 156/327 |
| 4,694,029 | A |   | 9/1987 | Land |
| 4,950,581 | A | * | 8/1990 | Koike ..................... G03F 7/029 430/281.1 |
| 5,266,384 | A |   | 11/1993 | O'Dell et al. |
| 5,340,653 | A |   | 8/1994 | Noren et al. |
| 6,132,558 | A |   | 10/2000 | Dyllick-Brenzinger et al. |
| 6,218,004 | B1 | * | 4/2001 | Shaw ........................ B05D 1/60 428/195.1 |
| 6,306,555 | B1 |   | 10/2001 | Schulz et al. |
| 6,398,999 | B1 |   | 6/2002 | Josephy et al. |
| 2002/0149659 | A1 |   | 10/2002 | Wu et al. |
| 2003/0008068 | A1 |   | 1/2003 | Josephy et al. |
| 2003/0119932 | A1 |   | 6/2003 | Al-Akhdar et al. |
| 2004/0141041 | A1 | * | 7/2004 | Tsutsumi ............... B41J 2/2056 347/102 |
| 2005/0004317 | A1 | * | 1/2005 | Auschra ................ C08F 293/00 525/244 |
| 2005/0171227 | A1 |   | 8/2005 | Weine Ramsey |
| 2005/0186371 | A1 | * | 8/2005 | Kimura .................... B41M 5/00 428/35.2 |
| 2006/0111466 | A1 | * | 5/2006 | Bujard .................. C09C 1/0015 523/160 |
| 2007/0014940 | A1 | * | 1/2007 | Linhart ................. B41M 5/5245 428/32.3 |
| 2008/0250970 | A1 | * | 10/2008 | Oyanagi ................. C09D 11/06 106/31.65 |
| 2008/0318150 | A1 |   | 12/2008 | Agrawal et al. |
| 2010/0090455 | A1 |   | 4/2010 | Boswell et al. |
| 2010/0272920 | A1 |   | 10/2010 | Garnett |
| 2011/0109712 | A1 |   | 5/2011 | Grant et al. |

(Continued)

FOREIGN PATENT DOCUMENTS

| CN | 101920607 | 12/2010 |
| CN | 101973170 | 2/2011 |

(Continued)

OTHER PUBLICATIONS

International Search Report and Written Opinion of the International Searching Authority dated Nov. 4, 2014, in PCT/EP2014/071001 Filed Oct. 1, 2014.
U.S. Appl. No. 14/423,843, filed Feb. 25, 2015, US 2015-0241845, Richert, et al.
U.S. Appl. No. 13/511,582, filed Jun. 27, 2012, US 2012-0301639, Grigorenko, et al.
U.S. Appl. No. 13/823,348, filed May 1, 2013, US 2013-0208327, Bolle, et al.
U.S. Appl. No. 14/127,292, filed Dec. 18, 2013, U.S. Pat. No. 8,993,219, Richert, et al.
U.S. Appl. No. 14/407,706, filed Dec. 12, 2014, US 2015-0158323, Richert, et al.

(Continued)

*Primary Examiner* — Dah-Wei D. Yuan
*Assistant Examiner* — Kristen A Dagenais-Englehart
(74) *Attorney, Agent, or Firm* — Oblon, McClelland, Maier & Neustadt, L.L.P.

(57) ABSTRACT

The instant invention pertains to a method for the production of brilliant glossy metal coatings on paper substrates. Further aspects of the invention are a paper product obtainable using the method and the use of such a paper for decorative or packaging purposes.

21 Claims, No Drawings

(56) References Cited

U.S. PATENT DOCUMENTS

| | | |
|---|---|---|
| 2012/0114918 A1 | 5/2012 | Voncken |
| 2012/0205426 A1 | 8/2012 | Neary |
| 2013/0002777 A1 | 1/2013 | Yano et al. |
| 2013/0316091 A1 | 11/2013 | Wittmann et al. |
| 2016/0024329 A1 | 1/2016 | Zhang |

FOREIGN PATENT DOCUMENTS

| | | |
|---|---|---|
| DE | 102010017429 | 12/2011 |
| EP | 0 562 897 A1 | 9/1993 |
| EP | 0 624 826 A1 | 11/1994 |
| JP | 08-267694 | 10/1996 |
| JP | 09-193302 | 7/1997 |
| JP | 10-72795 | 3/1998 |
| JP | 10-301276 A | 11/1998 |
| JP | 2000-280598 | 10/2000 |
| JP | 2002-347175 A | 12/2002 |
| WO | 90/01512 A1 | 2/1990 |
| WO | 93/01935 A1 | 2/1993 |
| WO | 98/46647 | 10/1998 |
| WO | 00/24946 A1 | 5/2000 |
| WO | WO 01/07175 | 2/2001 |
| WO | 02/053659 A2 | 7/2002 |
| WO | WO 2005/051675 | 6/2005 |
| WO | 2006/008251 A2 | 1/2006 |
| WO | WO 2007/033031 | 3/2007 |
| WO | 2007/040493 A1 | 4/2007 |
| WO | 2007/079541 A1 | 7/2007 |
| WO | 2008/055807 A2 | 5/2008 |
| WO | WO 2010/042999 | 4/2010 |
| WO | WO 2010/069823 A1 | 6/2010 |
| WO | 2010/104380 A1 | 9/2010 |
| WO | WO 2012/099698 | 7/2012 |
| WO | WO 2012-117905 | 9/2012 |
| WO | WO 2012/176126 | 12/2012 |
| WO | WO 2013/134359 | 9/2013 |
| WO | WO 2014/113425 | 7/2014 |

OTHER PUBLICATIONS

U.S. Appl. No. 13/391,079, filed Apr. 25, 2012, U.S. Pat. No. 9,310,676, Richert, et al.
U.S. Appl. No. 14/891,528, filed May 16, 2014, US 2016-0101642, Richert, et al.
U.S. Appl. No. 14/515,683, filed Oct. 16, 2014, US 2015-0035270, Ormerod et al.
Allen, N.S., et al., "A Comparative Kinetic Study of Commercial Photoinitiators for UV/visible Curable Acrylate Clear Coatings", Surface Coatings International, vol. 2, 1999, pp. 67-76.
Schmid, R., et al., "Luster Pigments with Optically Variable Properties", European Coatings Journal, 1997, 4 Pages.
"Printing Ink Manual", Blueprint, $5^{th}$ Edition, 1993, pp. 588-591 with cover pages.
"Printing Ink Manual", Blueprint, $5^{th}$ Edition, 1993, pp. 6-7 with cover pages.
"Printing Ink Manual", Blueprint, $5^{th}$ Edition, 1993, pp. 652-657 with cover pages.

\* cited by examiner

HIGH GLOSS METAL EFFECT PAPERS

The instant invention pertains to a method for the production of brilliant glossy metal coatings on paper substrates. Further aspects of the invention are a paper product obtainable using the method and the use of such a paper for decorative or packaging purposes.

Today's metal effect printing on paper is done by printing, for example, a solvent containing aluminum ink directly on paper or cardboard and subsequently overprinting it with a high gloss UV varnish. The result is a glossy surface, which however, is far away from the brilliant gloss of a metallic mirror like surface. A brilliant gloss on the other hand is an important aspect for the packaging industry and also for decorative purposes. Therefore, there is a strong need for very high glossy brilliant metallized papers in these industries. The instant invention meets this requirement and provides papers with a brilliant metallic gloss.

Surprisingly it has been found, that when printing a high gloss UV varnish directly on paper and overprinting it with a solvent based metallic ink, gloss becomes extremely high and brilliant.

Epoxy acrylates and/or ethoxylated amine modified polyether acrylates used in the composition of the UV varnish in combination with an ink based, for example on finest vapour deposited aluminum platelets provide a mirror like gloss to the final paper prints. When colorants are further added to the metal ink high gloss colored metallic effects are achieved.

The instant invention relates to a method for forming a smooth decorative surface coating exhibiting gloss on a paper or board substrate comprising the steps of:
A) applying a curable composition comprising one or more ethylenically unsaturated compounds and one or more photoinitiators to at least a portion of the frontside of the paper substrate;
B) curing the composition by using a UV lamp; and
C) printing an aluminum layer on the cured composition wherein the aluminum layer comprises a binder and vapour deposited aluminum particles with an mean diameter of from 5.0 µm to 15 µm and a thickness of from 7 nm to 32 nm.

The method is preferably performed on a printing apparatus which comprises
a) mechanism for feeding a paper substrate through the apparatus,
b) a coating station comprising a source of a liquid UV curable composition and means for applying a liquid composition from the source to a surface of the substrate, and means for curing the composition and
c) means for printing the metallic ink and subsequently drying the ink.

In one embodiment the apparatus of the present invention may be an off-line or stand alone unit or in an alternative, preferred embodiment this may be an in-line or integrated system with other further conventional printing, laminating, cutting, slitting and other converting stations as part of an integrated manufacturing process.

The paper or board substrate may be in the form of one or more sheets or a web. The paper substrate is preferably an opaque paper substrate that enables UV light transmission. For example the substrate has a thickness of 12 micron up to 300 micron. The paper substrate is selected from regular paper, banknote paper, synthetic paper, or a polymer banknote. Regular paper is made from wood pulp. Banknote paper is usually made from cotton. Synthetic paper contains a large part of synthetic resin derived from petroleum as its primary material. There are three major sub-classes of synthetic paper:
- film synthetic paper like Teslin® (PPG Industries; a microporous, highly filled, single layer, polyolefin synthetic material), or Yupo® (Covert-All, Inc.; an opaque white, multi-layered bi-axially oriented polypropylene (BOPP) product);
- fibre synthetic paper (polymer fibres instead of wood fibres); and
- film laminated synthetic paper: paper/film/paper, such as, for example, Durasafe® (Landquart); film/paper/film, such as, for example Hybrid banknote substrate (Giesecke & Devrient; combination of protective polyester film around a cotton fiber core).

The papers may contain optical brighteners, for example, stilbene type brighteners.

In a specific embodiment the paper substrate is a coated paper either single coated or double coated. Such papers are items of commerce and, for example, available from UPM-Kymmene Oyj under the tradename Raflabrite®. The thickness of such papers is typically in the range of from 50 µm to 150 µm.

In another embodiment the paper substrate is a board which may have a multilayer structure. Boards have typically a thickness of from 180 µm to 400 µm. Such boards are, for example, available from IGGESUND (Holmen Group) under the tradename Invercote®. These types of board are widely used for cigarette packaging.

The thickness of the papers is measured according to ISO 534.

In general the papers or boards which are suitable in the instant invention have a thickness of from 12 µm to 400 µm, preferably papers from 50 µm to 150 µm and boards from 151 µm to 300 µm.

For example, the paper or board substrate has a roughness of less than 1.5 µm, preferably less than 1.1 µm, as measured according to ISO 8791-4 (PPS 10).

Typically the paper or board substrate has a weight of from 30 g/m$^2$ to 300 g/m$^2$, as measured according to ISO 536.

The term paper or board substrate means the initial paper or board which is coated in the described process.

The substrate may comprise papers made from wood pulp or cotton or synthetic wood free fibres. The paper may be coated, calendared or machine glazed.

Surface texture or roughness of the coated paper is an important feature of the final paper product and contributes essentially to the mirror like gloss. It can, for example, be measured by digital microscope holography (DHM) using a magnification×5 objective lens in the 1$^{st}$-WL mode. The surface area measured is, for example, 1 mm×1 mm.

Sz values are the average distance of largest height (peak) and largest depth (whole) value found in the profile in nanometer. These Sz values are typically equal or below 300 nm for the paper products coated according to the instant invention.

The lamp used in the method and apparatus of the present invention has, for example, emission peak(s) in the UV-A range (400 nm to 320 nm) and short wavelength visible spectrum (400-450 nm). That is, the lamp has emission peak(s) in the range of from 320 to 450 nm.

UV radiation is generally classed as UV-A, UV-B, and UV-C as follows: UV-A: 400 nm to 320 nm UV-B: 320 nm to 290 nm UV-C: 290 nm to 100 nm.

Any ultraviolet light source may be employed as a radiation source, such as, a high or low pressure mercury lamp, a cold cathode tube, a black light, an ultraviolet LED, an ultraviolet laser, and a flash light.

Examples of lamps, which can be used in the process of the present invention, are shown below:

Medium pressure mercury arcs are modified by the inclusion of metal halides in small proportions to vary the spectral output:
iron doped—spectral output shifted to 350-450 nm;
gallium doped—emits very little UV; emission in the violet and blue spectral regions (expected additional UV lines by doping a mercury arc with metal iodides at wavelength/nm: Gallium (Ga) 403, 417 and Iron (Fe) 358, 372, 374/5, 382, 386, 388); and Focused Reflected Diode Array (FRDA) systems (igb-tech GmbH), such as for example FRDA 202 having an emission peak around 400 nm. Multi-spectrum lamps can also be used.

In another embodiment ultraviolet LED lamps may be used either alone or in combination with one of the aforementioned lamps.

For instance, the lamp used for curing the composition is a gallium, or iron doped medium pressure mercury lamp.

The lamp is part of an irradiator which consists of an aluminum housing containing a linear reflector with an elliptical (or, depending on application, parabolic) cross section. The reflector attached to the irradiator housing is made from a special aluminum which has a high degree of UV reflectivity and a resistance to tarnishing and corrosion.

The photoinitiator(s), or photoinitiator mixture and the lamp used should be optimised in dependence of the particular substrate type in order to achieve optimal printing speed.

In one embodiment the UV-curable composition is cured from the front side. However, it is also possible to cure the composition from the reverse side provided the paper has a certain opacity or transparency to allow UV light passing through.

Typically the photoinitiator is selected from benzophenone, alpha-hydroxy ketone type compounds, alpha-alkoxy ketone type compounds, alpha-amino ketone type compounds, mono and bisacylphosphine oxide compounds, phenylglyoxylate compounds, oxim ester compounds and onium salt compounds (sulfonium salt compounds and iodoinium salt compounds) and mixtures thereof.

For example the photoinitiator is selected from mono and bisacylphosphine oxide compounds, alpha-amino ketone type compounds, oxim ester compounds or mixtures thereof.

In a preferred embodiment the photoinitiator is selected from mono and bisacylphosphine oxide compounds and mixtures thereof.

Alternatively the curable composition comprises a mixture of a mono, or a bisacylphosphine oxide compound with a benzophenone compound, an alpha-hydroxy ketone, alpha-alkoxyketone, or alpha-aminoketone compound.

The, at present most preferred photoinitiators are mono and bisacylphosphine oxide compounds. Mono and bisacylphosphine oxide compounds can be used alone. Alternatively, a mixture of a mono and a bisacylphosphine oxide compound can be used, or the mono and bisacylphosphine oxide compounds can be used in admixture with other photoinitiators, such as, for example, the benzophenone type, alpha-amino ketone type, alpha-hydroxy ketone type, ketal compounds, phenylglyoxylate compounds, oxime ester compounds or onium salt compounds, especially a benzophenone compound, an alpha-hydroxy ketone, alpha-alkoxyketone, or alpha-aminoketone compound, very especially a benzophenone compound, an alpha-hydroxy ketone, or alpha-alkoxyketone compound. An alpha-aminoketone compound can be used, alone or in mixtures with other photoinitiators, if yellowing is not an issue.

Examples of photoinitiators are known to the person skilled in the art and for example published by Kurt Dietliker in "A compilation of photoinitiators commercially available for UV today", Sita Technology Textbook, Edinburgh, London, 2002.

Examples of suitable acylphosphine oxide compounds are of the formula XII

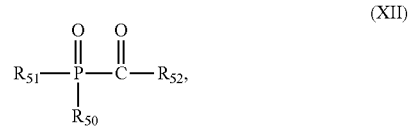

(XII)

wherein
$R_{50}$ is unsubstituted cyclohexyl, cyclopentyl, phenyl, naphthyl or biphenylyl; or is cyclohexyl, cyclopentyl, phenyl, naphthyl or biphenylyl substituted by one or more halogen, $C_1$-$C_{12}$alkyl, $C_1$-$C_{12}$alkoxy, $C_1$-$C_{12}$alkylthio or by $NR_{53}R_{54}$;

or $R_{50}$ is unsubstituted $C_1$-$C_{20}$alkyl or is $C_1$-$C_{20}$alkyl which is substituted by one or more halogen, $C_1$-$C_{12}$alkoxy, $C_1$-$C_{12}$alkylthio, $NR_{53}R_{54}$ or by —(CO)—O—$C_1$-$C_{24}$alkyl;

$R_{51}$ is unsubstituted cyclohexyl, cyclopentyl, phenyl, naphthyl or biphenylyl; or is cyclohexyl, cyclopentyl, phenyl, naphthyl or biphenylyl substituted by one or more halogen, $C_1$-$C_{12}$alkyl, $C_1$-$C_{12}$alkoxy, $C_1$-$C_{12}$alkylthio or by $NR_{53}R_{54}$; or $R_{51}$ is —(CO)R'$_{52}$; or $R_{51}$ is $C_1$-$C_{12}$alkyl which is unsubstituted or substituted by one or more halogen, $C_1$-$C_{12}$alkoxy, $C_1$-$C_{12}$alkylthio, or by $NR_{53}R_{54}$;

$R_{52}$ and R'$_{52}$ independently of each other are unsubstituted cyclohexyl, cyclopentyl, phenyl, naphthyl or biphenylyl, or are cyclohexyl, cyclopentyl, phenyl, naphthyl or biphenylyl substituted by one or more halogen, $C_1$-$C_4$alkyl or $C_1$-$C_4$alkoxy; or $R_{52}$ is a 5- or 6-membered heterocyclic ring comprising an S atom or N atom;

$R_{53}$ and $R_{54}$ independently of one another are hydrogen, unsubstituted $C_1$-$C_{12}$alkyl or $C_1$-$C_{12}$alkyl substituted by one or more OH or SH wherein the alkyl chain optionally is interrupted by one to four oxygen atoms; or $R_{53}$ and $R_{54}$ independently of one another are $C_2$-$C_{12}$-alkenyl, cyclopentyl, cyclohexyl, benzyl or phenyl;

Specific examples are bis(2,4,6-trimethylbenzoyl)-phenylphosphine oxide (Irgacure®819); 2,4,6-trimethylbenzoyl-diphenyl-phosphine oxide (Darocur®TPO); ethyl(2,4,6 trimethylbenzoyl phenyl)phosphinic acid ester; (2,4,6-trimethylbenzoyl)-2,4-dipentoxyphenylphosphine oxide, bis(2,6-dimethoxybenzoyl)-2,4,4-trimethylpentylphosphine oxide.

Interesting further are mixtures of the compounds of the formula XII with compounds of the formula XI as well as mixtures of different compounds of the formula XII.

Examples are mixtures of bis(2,6-dimethoxybenzoyl)-2,4,4-trimethylpentylphosphine oxide with 1-hydroxy-cyclohexyl-phenyl-ketone, of bis(2,4,6-trimethylbenzoyl)-phenylphosphine oxide with 2-hydroxy-2-methyl-1-phenyl-propan-1-one, of bis(2,4,6-trimethylbenzoyl)-phenylphosphine oxide with ethyl(2,4,6 trimethylbenzoyl phenyl)phosphinic acid ester, etc.

Examples of suitable benzophenone compounds are compounds of the formula X:

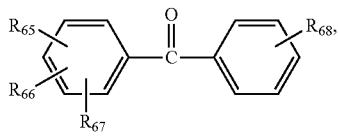
(X)

wherein $R_{65}$, $R_{66}$ and $R_{67}$ independently of one another are hydrogen, $C_1$-$C_4$alkyl, $C_1$-$C_4$-halogenalkyl, $C_1$-$C_4$alkoxy, Cl or $N(C_1$-$C_4$alkyl$)_2$;

$R_{68}$ is hydrogen, $C_1$-$C_4$alkyl, $C_1$-$C_4$halogenalkyl, phenyl, $N(C_1$-$C_4$alkyl$)_2$, COOCH$_3$,

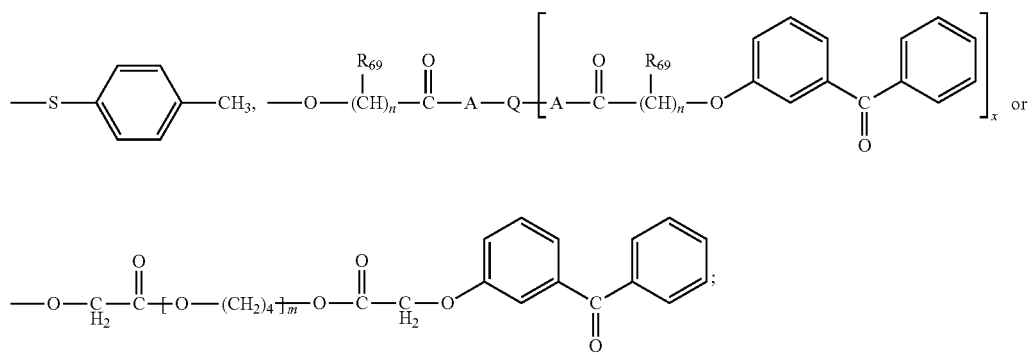

Q is a residue of a polyhydroxy compound having 2 to 6 hydroxy groups;

x is a number greater than 1 but no greater than the number of available hydroxyl groups in Q;

A is —[O(CH$_2$)$_b$CO]$_y$— or —[O(CH$_2$)$_b$CO]$_{(y-1)}$—[O(CHR$_{71}$CHR$_{70}$)$_a$]$_y$—;

$R_{69}$ is hydrogen, methyl or ethyl; and if N is greater than 1 the radicals $R_{69}$ may be the same as or different from each other;

a is a number from 1 to 2;

b is a number from 4 to 5;

y is a number from 1 to 10;

n is; and m is an integer 2-10.

Specific examples are Darocur®BP (=benzophenone), Esacure TZT® available from Lamberti, (a mixture of 2,4,6-trimethylbenzophenone and 4-methylbenzophenone), 4-phenylbenzophenone, 4-methoxybenzophenone, 4,4'-dimethoxybenzophenone, 4,4'-dimethylbenzophenone, 4,4'-dichlorobenzophenone, 4,4'-dimethylaminobenzophenone, 4,4'-diethylaminobenzophenone, 4-methylbenzophenone, 2,4,6-trimethylbenzophenone, 4-(4-methylthiophenyl)benzophenone, 3,3'-dimethyl-4-methoxybenzophenone, methyl-2-benzoylbenzoate, 4-(2-hydroxyethylthio)benzophenone, 4-(4-tolylthio)benzophenone, 4-benzoyl-N,N,N-trimethylbenzenemethanaminium chloride, 2-hydroxy-3-(4-benzoylphenoxy)-N,N,N-trimethyl-1-propanaminium chloride monohydrate, 4-(13-acryloyl-1,4,7,10,13-pentaoxatridecyl)benzophenone, 4-benzoyl-N,N-dimethyl-N-[2-(1-oxo-2-propenyl)oxy]ethylbenzenemethanaminium chloride; [4-(2-hydroxy-ethylsulfanyl)-phenyl]-(4-isopropylphenyl)-methanone; biphenyl-[4-(2-hydroxy-ethylsulfanyl)-phenyl]-methanone; biphenyl-4-yl-phenyl-methanone; biphenyl-4-yl-p-tolyl-methanone; biphenyl-4-yl-m-tolyl-methanone; [4-(2-hydroxy-ethylsulfanyl)-phenyl]p-tolyl-methanone; [4-(2-hydroxy-ethylsulfanyl)-phenyl]-(4-isopropyl-phenyl)-methanone; [4-(2-hydroxy-ethylsulfanyl)-phenyl]-(4-methoxy-phenyl)-methanone; 1-(4-benzoyl-phenoxy)-propan-2-one; [4-(2-hydroxy-ethylsulfanyl)-phenyl]-(4-phenoxy-phenyl)-methanone; 3-(4-benzoyl-phenyl)-2-dimethylamino-2-methyl-1-phenyl-propan-1-one; (4-chloro-phenyl)-(4-octylsulfanyl-phenyl)-methanone; (4-chloro-phenyl)-(4-dodecylsulfanyl-phenyl)-methanone; (4-bromo-phenyl)-(4-octylsulfanyl-phenyl)-methanone; (4-dodecylsulfanyl-phenyl)-(4-methoxy-phenyl)-methanone; (4-benzoyl-phenoxy)-acetic acid methyl ester; biphenyl-[4-(2-hydroxy-ethylsulfanyl)-phenyl]-methanone; 1-[4-(4-benzoylphenylsulfanyl)phenyl]-2-methyl-2-(4-methylphenylsulfonyl)propan-1-one (Esacure®1001 available from Lamberti).

Examples of suitable alpha-hydroxy ketone, alpha-alkoxyketone or alpha-aminoketone compounds are of the formula (XI)

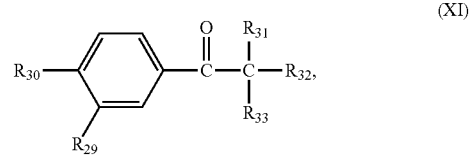
(XI)

wherein $R_{29}$ is hydrogen or $C_1$-$C_{18}$alkoxy;

$R_{30}$ is hydrogen, $C_1$-$C_{18}$alkyl, $C_1$-$C_{12}$hydroxyalkyl, $C_1$-$C_{18}$alkoxy, OCH$_2$CH$_2$—OR$_{34}$, morpholino, S—$C_1$-$C_{18}$alkyl, a group —HC=CH$_2$, —C(CH$_3$)=CH$_2$,

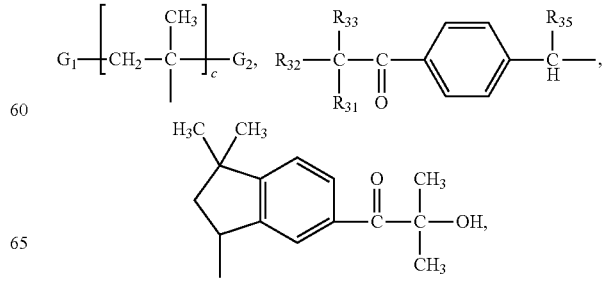

-continued

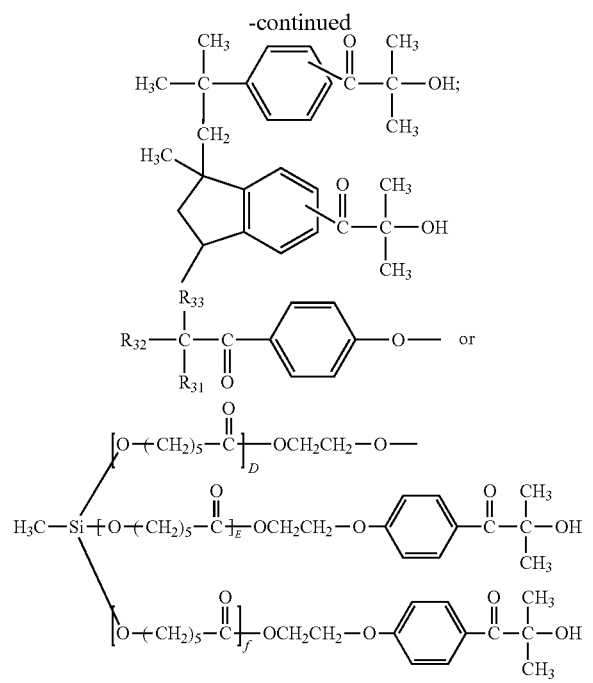

d, e and f are 1-3;
c is 2-10;
$G_1$ and $G_2$ independently of one another are end groups of the polymeric structure, preferably hydrogen or methyl;
$R_{34}$ is hydrogen,

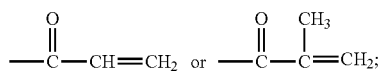

$R_{31}$ is hydroxy, $C_1$-$C_{16}$alkoxy, morpholino, dimethylamino or —O(CH$_2$CH$_2$O)$_g$—C$_1$-C$_{16}$alkyl;
g is 1-20;
$R_{32}$ and $R_{33}$ independently of one another are hydrogen, $C_1$-$C_6$alkyl, $C_1$-$C_{16}$alkoxy or —O(CH$_2$CH$_2$O)$_g$—C$_1$-C$_{16}$alkyl; or are unsubstituted phenyl or benzyl; or phenyl or benzyl substituted by $C_1$-$C_{12}$-alkyl; or $R_{32}$ and $R_{33}$ together with the carbon atom to which they are attached form a cyclohexyl ring;
$R_{35}$ is hydrogen, $OR_{36}$ or $NR_{37}R_{38}$;
$R_{36}$ is hydrogen, $C_1$-$C_{12}$alkyl which optionally is interrupted by one or more non-consecutive O-atoms and which uninterrupted or interrupted $C_1$-$C_{12}$alkyl optionally is substituted by one or more OH,
or

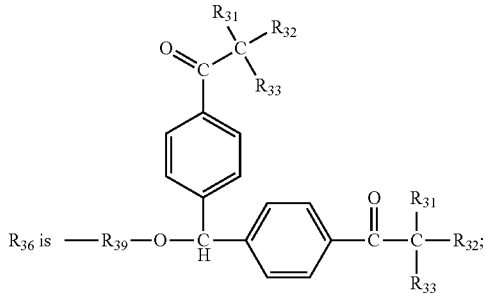

$R_{37}$ and $R_{38}$ independently of each other are hydrogen or $C_1$-$C_{12}$alkyl which is unsubstituted or is substituted by one or more OH;
$R_{39}$ is $C_1$-$C_{12}$alkylene which optionally is interrupted by one or more non-consecutive O, —(CO)—NH—$C_1$-$C_{12}$alkylene-NH—(CO)— or

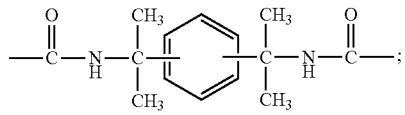

with the proviso that $R_{31}$, $R_{32}$ and $R_{33}$ not all together are $C_1$-$C_{16}$alkoxy or —O(CH$_2$CH$_2$O)$_g$—C$_1$-C$_{16}$alkyl.

Specific examples are 1-hydroxy-cyclohexyl-phenyl-ketone (Irgacure®184) or Irgacur®500 (a mixture of Irgacure®184 with benzophenone), 2-methyl-1[4-(methylthio)phenyl]-2-morpholinopropan-1-one (Irgacure®907), 2-benzyl-2-dimethylamino-1-(4-morpholino-phenyl)-butan-1-one (Irgacure®369), 2-dimethylamino-2-(4-methyl-benzyl)-1-(4-morpholin-4-yl-phenyl)-butan-1-one (Irgacure®379), (3,4-dimethoxy-benzoyl)-1-benzyl-1-dimethylamino propane, 1-[4-(2-hydroxyethoxy)-phenyl]-2-hydroxy-2-methyl-1-propan-1-one (Irgacure®2959), 2,2-dimethoxy-1,2-diphenylethan-1-one (Irgacure®651), 2-hydroxy-2-methyl-1-phenyl-propan-1-one (Darocur®1173), 2-hydroxy-1-{4-[4-(2-hydroxy-2-methyl-propionyl)-benzyl]-phenyl}-2-methyl-propan-1-one (Irgacure®127), 2-hydroxy-1-{4-[4-(2-hydroxy-2-methyl-propionyl)-phenoxy]-phenyl}-2-methyl-propan-1-one, Esacure KIP provided by Lamberti, 2-hydroxy-1-{1-[4-(2-hydroxy-2-methyl-propionyl)-phenyl]-1,3,3-trimethyl-indan-5-yl}-2-methyl-propan-1-one.

Irgacure® and Darocur® products are available from BASF SE.

Examples of suitable phenylglyoxylate compounds are of the formula XIII

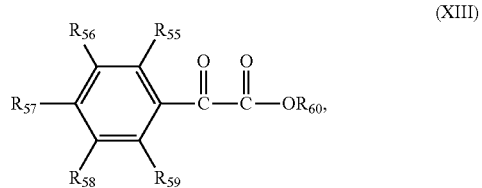

wherein
$R_{60}$ is hydrogen, $C_1$-$C_{12}$alkyl or

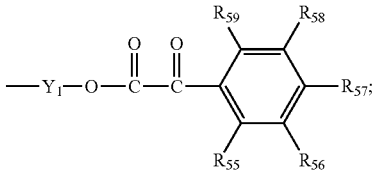

$R_{55}$, $R_{56}$, $R_{57}$, $R_{58}$ and $R_{59}$ independently of one another are hydrogen, unsubstituted $C_1$-$C_{12}$alkyl or $C_1$-$C_{12}$alkyl substituted by one or more OH, $C_1$-$C_4$alkoxy, phenyl, naphthyl, halogen or by CN; wherein the alkyl chain optionally is interrupted by one or more oxygen atoms; or $R_{55}$, $R_{56}$, $R_{57}$, $R_{58}$ and $R_{59}$ independently of one another are $C_1$-$C_4$alkoxy, $C_1$-$C_4$alkylthio or $NR_{52}R_{53}$;

$R_{52}$ and $R_{53}$ independently of one another are hydrogen, unsubstituted $C_1$-$C_{12}$alkyl or $C_1$-$C_{12}$alkyl substituted by one or more OH or SH wherein the alkyl chain optionally is interrupted by one to four oxygen atoms; or $R_{52}$ and $R_{53}$ independently of one another are $C_2$-$C_{12}$-alkenyl, cyclopentyl, cyclohexyl, benzyl or phenyl; and $Y_1$ is $C_1$-$C_{12}$alkylene optionally interrupted by one or more oxygen atoms.

Specific examples of the compounds of the formula XIII are oxo-phenyl-acetic acid 2-[2-(2-oxo-2-phenyl-acetoxy)-ethoxy]-ethyl ester (Irgacure®754), methyl α-oxo benzeneacetate.

Examples of suitable oxime ester compounds are of the formula XIV

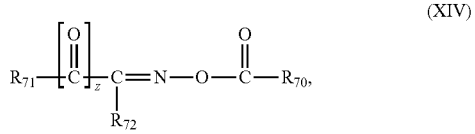

(XIV)

wherein z is 0 or 1;

$R_{70}$ is hydrogen, $C_3$-$C_8$cycloalkyl; $C_1$-$C_{12}$alkyl which is unsubstituted or substituted by one or more halogen, phenyl or by CN; or $R_{70}$ is $C_2$-$C_5$alkenyl; phenyl which is unsubstituted or substituted by one or more $C_1$-$C_6$alkyl, halogen, CN, $OR_{73}$, $SR_{74}$ or by $NR_{75}R_{76}$; or $R_{70}$ is $C_1$-$C_8$alkoxy, benzyloxy; or phenoxy which is unsubstituted or substituted by one or more $C_1$-$C_6$alkyl or by halogen;

$R_{71}$ is phenyl, naphthyl, benzoyl or naphthoyl, each of which is substituted by one or more halogen, $C_1$-$C_{12}$alkyl, $C_3$-$C_8$cycloalkyl, benzyl, phenoxycarbonyl, $C_2$-$C_{12}$alkoxycarbonyl, $OR_{73}$, $SR_{74}$, $SOR_{74}$, $SO_2R_{74}$ or by $NR_{75}R_{76}$, wherein the substituents $OR_{73}$, $SR_{74}$ and $NR_{75}R_{76}$ optionally form 5- or 6-membered rings via the radicals $R_{73}$, $R_{74}$, $R_{75}$ and/or $R_{76}$ with further substituents on the phenyl or naphthyl ring; or each of which is substituted by phenyl or by phenyl which is substituted by one or more $OR_{73}$, $SR_{74}$ or by $NR_{75}R_{66}$;

or $R_{71}$ is thioxanthyl, or

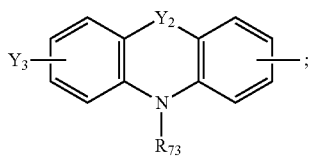

$R_{72}$ is hydrogen; unsubstituted $C_1$-$C_{20}$alkyl or $C_1$-$C_{20}$alkyl which is substituted by one or more halogen, $OR_{73}$, $SR_{74}$, $C_3$-$C_8$cycloalkyl or by phenyl; or is $C_3$-$C_8$cycloalkyl; or is phenyl which is unsubstituted or substituted by one or more $C_1$-$C_6$alkyl, phenyl, halogen, $OR_{73}$, $SR_{74}$ or by $NR_{75}R_{76}$; or is $C_2$-$C_{20}$alkanoyl or benzoyl which is unsubstituted or substituted by one or more $C_1$-$C_6$alkyl, phenyl, $OR_{73}$, $SR_{74}$ or by $NR_{75}R_{76}$; or is $C_2$-$C_{12}$alkoxycarbonyl, phenoxycarbonyl, CN, $CONR_{75}R_{76}$, $NO_2$, $C_1$-$C_4$haloalkyl, $S(O)_y$—$C_1$-$C_6$alkyl, or $S(O)_y$-phenyl, y is 1 or 2;

$Y_2$ is a direct bond or no bond;

$Y_3$ is $NO_2$ or

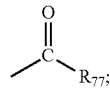

$R_{73}$ and $R_{74}$ independently of one another are hydrogen, $C_1$-$C_{20}$alkyl, $C_2$-$C_{12}$alkenyl, $C_3$-$C_8$cycloalkyl, $C_3$-$C_8$cycloalkyl which is interrupted by one or more, preferably 2, O, phenyl-$C_1$-$C_3$alkyl; or are $C_1$-$C_8$alkyl which is substituted by OH, SH, CN, $C_1$-$C_8$alkoxy, $C_1$-$C_8$alkanoyl, $C_3$-$C_8$cycloalkyl, by $C_3$-$C_8$cycloalkyl which is interrupted by one or more O, or which $C_1$-$C_8$alkyl is substituted by benzoyl which is unsubstituted or substituted by one or more $C_1$-$C_6$alkyl, halogen, OH, $C_1$-$C_4$alkoxy or by $C_1$-$C_4$alkylsulfanyl; or are phenyl or naphthyl, each of which is unsubstituted or substituted by halogen, $C_1$-$C_{12}$alkyl, $C_1$-$C_{12}$alkoxy, phenyl-$C_1$-$C_3$alkyloxy, phenoxy, $C_1$-$C_{12}$alkylsulfanyl, phenylsulfanyl, $N(C_1$-$C_{12}$alkyl)$_2$, diphenylamino or by

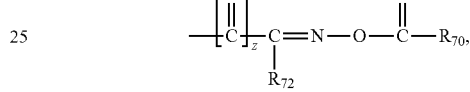

$R_{75}$ and $R_{76}$ independently of each other are hydrogen, $C_1$-$C_{20}$alkyl, $C_2$-$C_4$hydroxyalkyl, $C_2$-$C_{10}$alkoxyalkyl, $C_2$-$C_5$alkenyl, $C_3$-$C_8$cycloalkyl, phenyl-$C_1$-$C_3$alkyl, $C_1$-$C_8$alkanoyl, $C_3$-$C_{12}$alkenoyl, benzoyl; or are phenyl or naphthyl, each of which is unsubstituted or substituted by $C_1$-$C_{12}$alkyl, benzoyl or by $C_1$-$C_{12}$alkoxy; or $R_{75}$ and $R_{76}$ together are $C_2$-$C_6$alkylene optionally interrupted by O or $NR_{73}$ and optionally are substituted by hydroxyl, $C_1$-$C_4$alkoxy, $C_2$-$C_4$alkanoyloxy or by benzoyloxy;

$R_{77}$ is $C_1$-$C_{12}$alkyl, thienyl or phenyl which is unsubstituted or substituted by $C_1$-$C_{12}$alkyl, $OR_{73}$, morpholino or by N-carbazolyl.

Specific examples are 1,2-octanedione 1-[4-(phenylthio)phenyl]-2-(O-benzoyloxime) (Irgacure® OXE01), ethanone 1-[9-ethyl-6-(2-methylbenzoyl)-9H-carbazol-3-yl]-1-(O-acetyloxime) (Irgacure® OXE02), 9H-thioxanthene-2-carboxaldehyde 9-oxo-2-(O-acetyloxime), ethanone 1-[9-ethyl-6-(4morpholinobenzoyl)-9H-carbazol-3-yl]-1-(O-acetyloxime), ethanone 1-[9-ethyl-6-(2-methyl-4-(2-(1,3-dioxo-2-dimethyl-cyclopent-5-yl)ethoxy)-benzoyl)-9H-carbazol-3-yl]-1-(O-acetyloxime) (Adeka N-1919), ethanone 1-[9-ethyl-6-nitro-9H-carbazol-3-yl]-1-[2-methyl-4-(1-methyl-2-methoxy)ethoxy)phenyl]-1-(O-acetyloxime) (Adeka NCI831), etc.

It is also possible to add cationic photoinitiators, such as benzoyl peroxide (other suitable peroxides are described in U.S. Pat. No. 4,950,581, column 19, lines 17-25), or aromatic sulfonium, phosphonium or iodonium salts, such as are described, for example, in U.S. Pat. No. 4,950,581, column 18, line 60 to column 19, line 10.

Suitable sulfonium salt compounds are of formula XVa, XVb, XVc, XVd or XVe

XVa

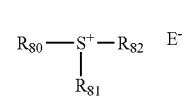

-continued

XVb

[structure with $R_{86}, R_{87}, R_{83}, R_{84}, R_{85}$ on thioxanthylium with $R_{88}$, $E^-$]

XVc

[structure: benzoate with $O-R_{97}$, $S^+-Ar_2$, $Ar_1$, $E^-$]

XVd

[structure: benzoate with $O-R_{96}$, $S^+-Ar_4-X-L$, $Ar_1$, bracket subscript 2, $2\,E^-$]

XVe

[structure: benzoate with $O-R_{96}$, $S^+-Ar_4$, $Ar_1$, bracket subscript 2, $2\,E^-$]

wherein $R_{80}$, $R_{81}$ and $R_{82}$ are each independently of the others unsubstituted phenyl, or phenyl substituted by —S-phenyl,

[structure: —S—phenyl—$S^+$—phenyl—O—CH$_2$CH$_2$OH, $E^-$, subscript 2]

[structure: —S—phenyl—$S^+$—phenyl, $E^-$, subscript 2]

or by

[structure: —S—phenyl—C(O)—CH$_3$]

$R_{83}$ is a direct bond, S, O, CH$_2$, (CH$_2$)$_2$, CO or NR$_{89}$;

$R_{84}$, $R_{85}$, $R_{86}$ and $R_{87}$ independently of one another are hydrogen, C$_1$-C$_{20}$alkyl, C$_3$-C$_8$cycloalkyl, C$_1$-C$_{20}$alkoxy, C$_2$-C$_{20}$alkenyl, CN, OH, halogen, C$_1$-C$_6$alkylthio, phenyl, naphthyl, phenyl-C$_1$-C$_7$alkyl, naphthyl-C$_1$-C$_3$alkyl, phenoxy, naphthyloxy, phenyl-C$_1$-C$_7$alkyloxy, naphthyl-C$_1$-C$_3$alkyloxy, phenyl-C$_2$-C$_6$alkenyl, naphthyl-C$_2$-C$_4$alkenyl, S-phenyl, (CO)R$_{89}$, O(CO)R$_{89}$, (CO)OR$_{89}$, SO$_2$R$_{89}$ or OSO$_2$R$_{89}$;

$R_{88}$ is C$_1$-C$_{20}$alkyl, C$_1$-C$_{20}$hydroxyalkyl,

[structure with $R_{90}, R_{91}, R_{92}, R_{93}$] , [structure with $R_{90}, R_{91}, R_{92}, R_{93}, R_{80}$] or

[structure with $R_{103}$, thioxanthylium with $R_{84}, R_{85}, R_{83}$]

$R_{89}$ is hydrogen, C$_1$-C$_{12}$alkyl, C$_1$-C$_{12}$hydroxyalkyl, phenyl, naphthyl or biphenylyl;

$R_{90}$, $R_{91}$, $R_{92}$ and $R_{93}$ independently of one another have one of the meanings as given for $R_{84}$; or $R_{90}$ and $R_{91}$ are joined to form a fused ring system with the benzene rings to which they are attached;

$R_{95}$ is a direct bond, S, O or CH$_2$;

$R_{96}$ is hydrogen, C$_1$-C$_{20}$alkyl; C$_2$-C$_{20}$alkyl interrupted by one or more O; or is -L-M-R$_{98}$ or -L-R$_{98}$;

$R_{97}$ has one of the meanings as given for $R_{96}$ or is

[structure: —L—O—C(O)—phenyl—$S^+$(Ar$_2$)(Ar$_1$), $E^-$];

$R_{98}$ is a monovalent sensitizer or photoinitiator moiety;

Ar$_1$ and Ar$_2$ independently of one another are phenyl unsubstituted or substituted by C$_1$-C$_{20}$alkyl, halogen or OR$_{99}$;

or are unsubstituted naphthyl, anthryl, phenanthryl or biphenylyl;

or are naphthyl, anthryl, phenanthryl or biphenylyl substituted by C$_1$-C$_{20}$alkyl, OH or OR$_{99}$;

or are —Ar$_4$-A$_1$-Ar$_3$ or

[structure with $M_1, M_2, R_{100}, R_{101}$];

Ar$_3$ is unsubstituted phenyl, naphthyl, anthryl, phenanthryl or biphenylyl;

or is phenyl, naphthyl, anthryl, phenanthryl or biphenylyl substituted by C$_1$-C$_{20}$alkyl, OR$_{99}$ or benzoyl;

Ar$_4$ is phenylene, naphthylene, anthrylene or phenanthrylene;

A$_1$ is a direct bond, S, O or C$_1$-C$_{20}$alkylene;

X is CO, C(O)O, OC(O), O, S or NR$_{99}$;

L is a direct bond, S, O, C$_1$-C$_{20}$alkylene or C$_2$-C$_{20}$alkylene interrupted by one or more non-consecutive O;

$R_{99}$ is $C_1$-$C_{20}$alkyl or $C_1$-$C_{20}$hydroxyalkyl; or is $C_1$-$C_{20}$alkyl substituted by $O(CO)R_{102}$;

$M_1$ is S, CO or $NR_{100}$;

$M_2$ is a direct bond, $CH_2$, O or S;

$R_{100}$ and $R_{101}$ independently of one another are hydrogen, halogen, $C_1$-$C_8$alkyl, $C_1$-$C_8$alkoxy or phenyl;

$R_{102}$ is $C_1$-$C_{20}$alkyl;

$R_{103}$ is

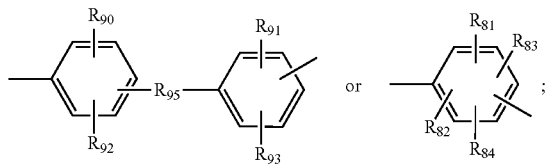

and

E is an anion, especially $PF_6$, $SbF_6$, $AsF_6$, $BF_4$, $(C_6F_5)_4B$, Cl, Br, $HSO_4$, $CF_3$—$SO_3$, F—$SO_3$,

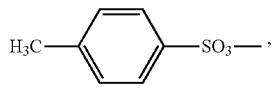

$CH_3$—$SO_3$, $ClO_4$, $PO_4$, $NO_3$, $SO_4$, $CH_3$—$SO_4$, or

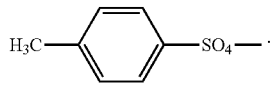

Specific examples of sulfonium salt compounds are for example Irgacure®270 (BASF SE); Cyracure® UVI-6990, Cyracure® UVI-6974 (Union Carbide), Degacure®KI 85 (Degussa), SP-55, SP-150, SP-170 (Asahi Denka), GE UVE 1014 (General Electric), SarCat®KI-85 (=triarylsulfonium hexafluorophosphate; Sartomer), SarCat® CD 1010 (=mixed triarylsulfonium hexafluoroantimonate; Sartomer); SarCat® CD 1011 (=mixed triarylsulfonium hexafluorophosphate; Sartomer), Suitable iodonium salt compounds are of formula XVI

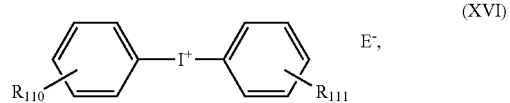

(XVI)

wherein $R_{110}$ and $R_{111}$ are each independently of the other hydrogen, $C_1$-$C_{20}$alkyl, $C_1$-$C_{20}$alkoxy, OH-substituted $C_1$-$C_{20}$alkoxy, halogen, $C_2$-$C_{12}$alkenyl, $C_3$-$C_8$cycloalkyl, especially methyl, isopropyl or isobutyl; and E is an anion, especially $PF_6$, $SbF_6$, $AsF_6$, $BF_4$, $(C_6F_5)_4B$, Cl, Br, $HSO_4$, $CF_3$—$SO_3$, F—$SO_3$,

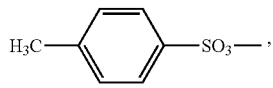

$CH_3$—$SO_3$, $ClO_4$, $PO_4$, $NO_3$, $SO_4$, $CH_3$—$SO_4$ or

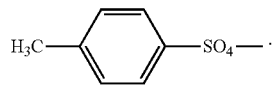

Specific examples of iodonium salt compounds are e.g. tolylcumyliodonium tetrakis(pentafluorophenyl)borate, 4-[(2-hydroxy-tetradecyloxy)phenyl]phenyliodonium hexafluoroantimonate or hexafluorophosphate, tolylcumyliodonium hexafluorophosphate, 4-isopropylphenyl-4'-methylphenyliodonium hexafluorophosphate, 4-isobutylphenyl-4'-methylphenyliodonium hexafluorophosphate (Irgacure®250, BASF SE), 4-octyloxyphenyl-phenyliodonium hexafluorophosphate or hexafluoroantimonate, bis(dodecylphenyl)iodonium hexafluoroantimonate or hexafluorophosphate, bis(4-methylphenyl)iodonium hexafluorophosphate, bis(4-methoxyphenyl)iodonium hexafluorophosphate, 4-methylphenyl-4'-ethoxyphenyliodonium hexafluorophosphate, 4-methylphenyl-4'-dodecylphenyliodonium hexafluorophosphate, 4-methylphenyl-4'-phenoxyphenyliodonium hexafluorophosphate.

Of all the iodonium salts mentioned, compounds with other anions are, of course, also suitable. The preparation of iodonium salts is known to the person skilled in the art and described in the literature, for example U.S. Pat. Nos. 4,151,175, 3,862,333, 4,694,029, EP 562897, U.S. Pat. Nos. 4,399,071, 6,306,555, WO 98/46647 J. V. Crivello, "Photoinitiated Cationic Polymerization" in: UV Curing: Science and Technology, Editor S. P. Pappas, pages 24-77, Technology Marketing Corporation, Norwalk, Conn. 1980, ISBN No. 0-686-23773-0; J. V. Crivello, J. H. W. Lam, Macromolecules, 10, 1307 (1977) and J. V. Crivello, Ann. Rev. Mater. Sci. 1983, 13, pages 173-190 and J. V. Crivello, Journal of Polymer Science, Part A: Polymer Chemistry, Vol. 37, 4241-4254 (1999).

Halogen is fluorine, chlorine, bromine and iodine.

$C_1$-$C_{24}$alkyl ($C_1$-$C_{20}$alkyl, especially $C_1$-$C_{12}$alkyl) is typically linear or branched, where possible. Examples are methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, dodecyl, tridecyl, tetradecyl, pentadecyl, hexadecyl, heptadecyl, or octadecyl. $C_1$-$C_8$alkyl is typically methyl, ethyl, n-propyl, isopropyl, n-butyl, sec.-butyl, isobutyl, tert.-butyl, n-pentyl, 2-pentyl, 3-pentyl, 2,2-dimethyl-propyl, n-hexyl, n-heptyl, n-octyl, 1,1,3,3-tetramethylbutyl and 2-ethylhexyl. $C_1$-$C_4$alkyl is typically methyl, ethyl, n-propyl, isopropyl, n-butyl, sec.-butyl, isobutyl, tert.-butyl.

$C_2$-$C_{12}$alkenyl ($C_2$-$C_5$alkenyl) groups are straight-chain or branched alkenyl groups, such as e.g. vinyl, allyl, methallyl, isopropenyl, 2-butenyl, 3-butenyl, isobutenyl, n-penta-2,4-dienyl, 3-methyl-but-2-enyl, n-oct-2-enyl, or n-dodec-2-enyl.

$C_1$-$C_{12}$alkoxy groups ($C_1$-$C_8$alkoxy groups) are straight-chain or branched alkoxy groups, e.g. methoxy, ethoxy, n-propoxy, isopropoxy, n-butoxy, sec-butoxy, tert-butoxy, amyloxy, isoamyloxy or tert-amyloxy, heptyloxy, octyloxy, isooctyloxy, nonyloxy, decyloxy, undecyloxy and dodecyloxy.

$C_1$-$C_{12}$alkylthio groups ($C_1$-$C_8$ alkylthio groups) are straight-chain or branched alkylthio groups and have the same preferences as the akoxy groups, except that oxygen is exchanged against sulfur.

$C_1$-$C_{12}$alkylene is bivalent $C_1$-$C_{12}$alkyl, i.e. alkyl having two (instead of one) free valencies, e.g. trimethylene or tetramethylene.

A cycloalkyl group is typically $C_3$-$C_8$cycloalkyl, such as, for example, cyclopentyl, cyclohexyl, cycloheptyl, or cyclooctyl, which may be unsubstituted or substituted.

In several cases it is advantageous in addition to the photoinitiator to employ a sensitizer compound. Examples of suitable sensitizer compounds are disclosed in WO 06/008251, page 36, line 30 to page 38, line 8, the disclosure of which is hereby incorporated by reference. As sensitizer inter alia benzophenone compounds as described above can be employed.

In one embodiment of the invention the photoinitiator is selected from mono and bisacylphosphine oxide, alpha-hydroxy ketone, alpha-alkoxyketone, or alpha-aminoketone compounds and mixtures thereof.

The curable composition is cured by ultraviolet (U.V.) light. This type of composition is often called a UV-laquer. UV curing lacquers are commercial products and can be obtained, for example, from BASF SE. The lacquers exposed to actinic radiations used in the present invention are required to reach a solidified stage after exposure to UV-light. Particularly suitable for the lacquers compositions are chemistries used in the radiation curable industries in industrial coatings and graphic arts. Particularly suitable are compositions containing one or several photo-latent catalysts that will initiate polymerization of the exposed lacquer layer to UV radiation. Particularly suitable for fast curing and conversion to a solid state are compositions comprising one or several monomers and oligomers sensitive to free-radical polymerization, such as acrylates, methacrylates or monomers or/and oligomers, containing at least one ethylenically unsaturated group.

The unsaturated compounds may include one or more olefinic double bonds. They may be of low (monomeric) or high (oligomeric) molecular mass. Examples of monomers containing a double bond are alkyl, hydroxyalkyl or amino acrylates, or alkyl, hydroxyalkyl or amino methacrylates, for example methyl, ethyl, butyl, 2-ethylhexyl or 2-hydroxyethyl acrylate, isobornyl acrylate, methyl methacrylate or ethyl methacrylate. Silicone acrylates are also advantageous. Other examples are acrylonitrile, acrylamide, methacrylamide, N-substituted (meth)acrylamides, vinyl esters such as vinyl acetate, vinyl ethers such as isobutyl vinyl ether, styrene, alkyl- and halostyrenes, N-vinylpyrrolidone, vinyl chloride or vinylidene chloride.

Examples of monomers containing two or more double bonds are the diacrylates of ethylene glycol, propylene glycol, neopentyl glycol, hexamethylene glycol or of bisphenol A, and 4,4'-bis(2-acryl-oyloxyethoxy)diphenylpropane, trimethylolpropane triacrylate, pentaerythritol triacrylate or tetraacrylate, vinyl acrylate, divinylbenzene, divinyl succinate, diallyl phthalate, triallyl phosphate, triallyl isocyanurate or tris(2-acryloylethyl)isocyanurate. Examples of polyunsaturated compounds of relatively high molecular mass (oligomers) are acrylated epoxy resins, polyesters containing acrylate-, vinyl ether- or epoxy-groups, and also polyurethanes and polyethers. Further examples of unsaturated oligomers are unsaturated polyester resins, which are usually prepared from maleic acid, phthalic acid and one or more diols and have molecular weights of from about 500 to 3000. In addition it is also possible to employ vinyl ether monomers and oligomers, and also maleate-terminated oligomers with polyester, polyurethane, polyether, polyvinyl ether and epoxy main chains. Of particular suitability are combinations of oligomers which carry vinyl ether groups and of polymers as described in WO90/01512. However, copolymers of vinyl ether and maleic acid-functionalized monomers are also suitable. Unsaturated oligomers of this kind can also be referred to as prepolymers.

Particularly suitable examples are esters of ethylenically unsaturated carboxylic acids and polyols or polyepoxides, and polymers having ethylenically unsaturated groups in the chain or in side groups, for example unsaturated polyesters, polyamides and polyurethanes and copolymers thereof, polymers and copolymers containing (meth)acrylic groups in side chains, and also mixtures of one or more such polymers.

Examples of unsaturated carboxylic acids are acrylic acid, methacrylic acid, crotonic acid, itaconic acid, cinnamic acid, and unsaturated fatty acids such as linolenic acid or oleic acid. Acrylic and methacrylic acid are preferred.

Suitable polyols are aromatic and, in particular, aliphatic and cycloaliphatic polyols. Examples of aromatic polyols are hydroquinone, 4,4'-dihydroxydiphenyl, 2,2-di(4-hydroxyphenyl)propane, and also novolaks and resols. Examples of polyepoxides are those based on the abovementioned polyols, especially the aromatic polyols, and epichlorohydrin. Other suitable polyols are polymers and copolymers containing hydroxyl groups in the polymer chain or in side groups, examples being polyvinyl alcohol and copolymers thereof or polyhydroxyalkyl methacrylates or copolymers thereof. Further polyols which are suitable are oligoesters having hydroxyl end groups.

Examples of aliphatic and cycloaliphatic polyols are alkylenediols having preferably 2 to 12 C atoms, such as ethylene glycol, 1,2- or 1,3-propanediol, 1,2-, 1,3- or 1,4-butanediol, pentanediol, hexanediol, octanediol, dodecanediol, diethylene glycol, triethylene glcyol, polyethylene glycols having molecular weights of preferably from 200 to 1500, 1,3-cyclopentanediol, 1,2-, 1,3- or 1,4-cyclohexanediol, 1,4-dihydroxymethylcyclohexane, glycerol, tris(β-hydroxyethyl)amine, trimethylolethane, trimethylolpropane, pentaerythritol, dipentaerythritol and sorbitol.

The polyols may be partially or completely esterified with one carboxylic acid or with different unsaturated carboxylic acids, and in partial esters the free hydroxyl groups may be modified, for example etherified or esterified with other carboxylic acids.

Examples of esters are: trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol diacrylate, 1,3-butanediol diacrylate, 1,3-butanediol dimethacrylate, 1,4-butanediol diitaconate, sorbitol triacrylate, sorbitol tetraacrylate, pentaerythritol-modified triacrylate, sorbitol tetra methacrylate, sorbitol pentaacrylate, sorbitol hexaacrylate, oligoester acrylates and methacrylates, glycerol diacrylate and triacrylate, 1,4-cyclohexane diacrylate, bisacrylates and bismethacrylates of polyethylene glycol with a molecular weight of from 200 to 1500, or mixtures thereof.

Also suitable as polymerizable components are the amides of identical or different, unsaturated carboxylic acids with aromatic, cycloaliphatic and aliphatic polyamines having preferably 2 to 6, especially 2 to 4, amino groups. Examples of such polyamines are ethylenediamine, 1,2- or 1,3-propylenediamine, 1,2-, 1,3- or 1,4-butylenediamine, 1,5-pentylenediamine, 1,6-hexylenediamine, octylenediamine, dodecylenediamine, 1,4-diaminocyclohexane, isophoronediamine, phenylenediamine, bisphenylenediamine, di-ß-aminoethyl ether, diethylenetriamine, triethylenetramine, di(ß-aminoethoxy)- or di(ß-aminopropoxy)ethane. Other suitable polyamines are polymers and copolymers, preferably with additional amino groups in the side chain, and oligoamides having amino end groups. Examples of such unsaturated amides are methylenebisacrylamide, 1,6-hexamethylenebisacrylamide, diethylenetriaminetrismethacrylamide, bis(methacrylamidopropoxy)ethane, ß-methacrylamidoethyl methacrylate and N[(ß-hydroxyethoxy)ethyl]acrylamide.

Suitable unsaturated polyesters and polyamides are derived, for example, from maleic acid and from diols or diamines. Some of the maleic acid can be replaced by other dicarboxylic acids. They can be used together with ethylenically unsaturated comonomers, for example styrene. The polyesters and polyamides may also be derived from dicarboxylic acids and from ethylenically unsaturated diols or diamines, especially from those with relatively long chains of, for example 6 to 20 C atoms. Examples of polyurethanes are those composed of saturated or unsaturated diisocyanates and of unsaturated or, respectively, saturated diols.

Polymers with (meth)acrylate groups in the side chain are likewise known. They may, for example, be reaction products of epoxy resins based on novolaks with (meth)acrylic acid, or may be homo- or copolymers of vinyl alcohol or hydroxyalkyl derivatives thereof which are esterified with (meth)acrylic acid, or may be homo- and copolymers of (meth)acrylates which are esterified with hydroxyalkyl (meth)acrylates.

Other suitable polymers with acrylate or methacrylate groups in the side chains are, for example, solvent soluble or alkaline soluble polyimide precursors, for example poly (amic acid ester) compounds, having the photopolymerizable side groups either attached to the backbone or to the ester groups in the molecule, i.e. according to EP624826. Such oligomers or polymers can be formulated with optionally reactive diluents, like polyfunctional (meth)acrylates in order to prepare highly sensitive polyimide precursors.

Examples of polymerizable components are also polymers or oligomers having at least two ethylenically unsaturated groups and at least one carboxyl function within the molecule structure, such as a resin obtained by the reaction of a saturated or unsaturated polybasic acid anhydride with a product of the reaction of an epoxy compound and an unsaturated monocarboxylic acid, for example, photosensitive compounds as described in JP 10-301276 and commercial products such as for example EB9696, UCB Chemicals; KAYAR-AD TCR1025, Nippon Kayaku Co., LTD., NK OLIGO EA-6340, EA-7440 from Shin-Nakamura Chemical Co., Ltd., or an addition product formed between a carboxyl group-containing resin and an unsaturated compound having an α,β-unsaturated double bond and an epoxy group (for example, ACA200M, Daicel Industries, Ltd.). Additional commercial products as examples of polymerizable component are ACA200, ACA210P, ACA230AA, ACA250, ACA300, ACA320 from Daicel Chemical Industries, Ltd.

The photopolymerizable compounds are used alone or in any desired mixtures. It is preferred to use mixtures of polyol (meth)acrylates.

As diluent, a mono- or multi-functional ethylenically unsaturated compound, or mixtures of several of said compounds, can be included in the above composition up to 70% by weight based on the solid portion of the composition.

The invention also provides compositions comprising as polymerizable component at least one ethylenically unsaturated photopolymerizable compound which is emulsified or dissolved in water, or organic solvents.

The unsaturated polymerizable components can also be used in admixture with non-photopolymerizable, film-forming components. These may, for example, be physically drying polymers or solutions thereof in organic solvents, for instance nitrocellulose or cellulose acetobutyrate. They may also, however, be chemically and/or thermally curable (heat-curable) resins, examples being polyisocyanates, polyepoxides and melamine resins, as well as polyimide precursors. The use of heat-curable resins at the same time is important for use in systems known as hybrid systems, which in a first stage are photopolymerized and in a second stage are crosslinked by means of thermal aftertreatment.

The polymerizable compositions may additionally comprise a solvent. The solvent may be ester/alcohol blends and preferably normal propyl acetate and ethanol. More preferably, the ester/alcohol blend is in a ratio of between 10:1 and 40:1, even more preferably 20:1 to 30:1. The solvent used may comprise any one or more of an ester, such as n-propyl acetate, iso-propyl acetate, ethyl acetate, butyl acetate; an alcohol, such as ethyl alcohol, industrial methylated spirits, isopropyl alcohol or normal propyl alcohol; a ketone, such as methyl ethyl ketone or acetone; an aromatic hydrocarbon, such as toluene, and water.

Although water may be used as a diluent alone, it is used in most cases together with an organic solvent such as an alcohol.

A photoinitiator, or a mixture of photoinitiators is incorporated into the formulation/composition to initiate the UV-curing process.

In a specific embodiment the curable composition comprises (a) 5.0 to 0.5, especially 5.0 to 1.0, very especially 4.0 to 2.5% by weight of photoinitiator, and (b) 99.5 to 95, especially 99 to 95, very especially 97.5 to 96% by weight of one or more ethylenically unsaturated resins, monomers or mixtures thereof, wherein the sum of components a) to c) adds up to 100%.

In general the photoinitiator is typically added in an amount of 1% to 20%, preferably 3% to 10% by weight, based on the weight of the total curable composition.

The curable composition may comprise various additives. Examples thereof include thermal inhibitors, light stabilisers, optical brighteners, fillers and pigments, as well as white and coloured pigments, dyes, antistatics, adhesion promoters, wetting agents, flow auxiliaries, lubricants, waxes, antiadhesive agents, dispersants, emulsifiers, anti-oxidants; fillers, e.g. talcum, gypsum, silicic acid, rutile, carbon black, zinc oxide, iron oxides; reaction accelerators, thickeners, matting agents, antifoams, leveling agents and other adjuvants customary, for example, in lacquer, ink and coating technology.

The UV lacquer may comprise an epoxy-acrylate from the CRAYNOR® Sartomer Europe range, or the LAROMER® range available from BASF SE (10 to 60%) and one or several acrylates (monofunctional and multifunctional), monomers which are available from Sartomer Europe, or BASF SE (20 to 90%) and one, or several photoinitiators (1 to 15%) such as Irgacure® 819 (BASF SE) and a levelling agent such as BYK®361 (0.01 to 1%) from BYK Chemie.

In a further embodiment of the present invention the ultraviolet coating can be coloured. That is the curable composition may comprise pigments and/or dyes. The pigments can be transparent organic color pigments or inorganic pigments.

Suitable colored pigments especially include organic pigments selected from the group consisting of azo, azomethine, methine, anthraquinone, phthalocyanine, perinone, perylene, diketopyrrolopyrrole, thioindigo, dioxazine iminoisoindoline, dioxazine, iminoisoindolinone, quinacridone, flavanthrone, indanthrone, anthrapyrimidine and quinophthalone pigments, or a mixture or solid solution thereof; especially a dioxazine, diketopyrrolopyrrole, quinacridone, phthalocyanine, indanthrone or iminoisoindolinone pigment, or a mixture or solid solution thereof.

Colored organic pigments of particular interest include C.I. Pigment Red 202, C.I. Pigment Red 122, C. I. Pigment Red 178, C.I. Pigment Red 179, C.I. Pigment Red 170, C.I. Pigment Red 144, C.I. Pigment Red 177, C.I. Pigment Red 254, C.I. Pigment Red 255, C.I. Pigment Red 264, C.I. Pigment Brown 23, C.I. Pigment Yellow 109, C.I. Pigment Yellow 110, C. I. Pigment Yellow 138, C.I. Pigment Yellow 147, C. I. Pigment Yellow 150, C. I. Pigment Yellow 151, C. I. Pigment Yellow 155, C. I. Pigment Yellow 185, C.I. Pigment Orange 61, C.I. Pigment Orange 71, C.I. Pigment Orange 73, C.I. Pigment Orange 48, C.I. Pigment Orange 49, C.I. Pigment Blue 15, C. I. Pigment Blue 16, C.I. Pigment Blue 60, C.I. Pigment Violet 23, C.I. Pigment Violet 37, C.I. Pigment Violet 19, C.I. Pigment Green 7, C.I. Pigment Green 36, the 2,9-dichloro-quinacridone in platelet form described in WO08/055807, or a mixture or solid solution thereof.

Suitable colored pigments also include conventional inorganic pigments; especially those selected from the group consisting of metal oxides, titaniumdioxide, antimony yellow, lead chromate, lead chromate sulfate, lead molybdate, ultramarine blue, cobalt blue, manganese blue, chrome oxide green, hydrated chrome oxide green, cobalt green and metal sulfides, such as cerium or cadmium sulfide, cadmium sulfoselenides, zinc ferrite, bismuth vanadate, Prussian blue, $Fe_3O_4$, carbon black and mixed metal oxides. Examples of commercially available inorganic pigments are BAYFERROX® 3920, BAYFERROX® 920, BAYFERROX® 645T, BAYFERROX® 303T, BAYFERROX® 110, BAYFERROX® 110 M, CHROMOXIDGRUEN GN, and CHROMOXIDGRUEN GN-M.

Examples of dyes, which can be used to color the curable composition, are selected from the group consisting of azo, azomethine, methine, anthraquinone, phthalocyanine, dioxazine, flavanthrone, indanthrone, anthrapyrimidine and metal complex dyes. Monoazo dyes, cobalt complex dyes, chrome complex dyes, anthraquinone dyes and copper phthalocyanine dyes are preferred.

Further examples are functional dyes and pigments, for example magnetic pigments, IR-absorbers, fluorescent and phosphorescent materials, thermochromic dyes and pigments.

In a typical embodiment of the invention the curable composition comprises an ethoxylated oligo ether acrylate, an ethoxylated amine modified polyether acrylate, an epoxy acrylate, a polyester acrylate or an urethane acrylate.

More specifically the curable composition comprises an ethoxylated amine modified polyether acrylate or an epoxy acrylate.

The term epoxy acrylate comprises aliphatic epoxy acrylates and aromatic epoxy acrylates and mixtures thereof.

The curable composition may be deposited, for example, by means of gravure, flexographic or screen printing. However, other applications are also possible, such as coating with a slot or nive coater, a wire bar or a doctor blade.

The UV coating thickness is typically from 2 to 24 μm.

The aluminum particles are produced by physical vapor deposition (PVD metal pigment). The general operating range of vacuum deposition may be in the range of 5 to 50 nm. The thickness of the aluminum particles in the instant invention is from 7 nm to 32 nm. The mean diameter D50 of the aluminum particles is from 5.0 μm to 15 μm.

In the context of the present invention the term mean diameter comprises also the length of rectangular particles.

In a specific embodiment the mean diameter of the vapor deposited aluminum particles is from 8.0 μm to 12 μm and the thickness is from 11-18 nm.

In another specific embodiment the average diameter of the vapor deposited aluminum particles is from 8.0 μm to 12 μm and the thickness is from 12-14 nm.

In a further specific embodiment the average diameter of the vapor deposited aluminum particles is from 8.0 μm to 12 μm and the thickness is from 7-20 nm.

In a preferred embodiment the mean diameter of the vapor deposited aluminum particles is from 8.0 μm to 12 μm and the thickness is 13 nm.

In another preferred embodiment the average diameter of the vapor deposited aluminum particles is from 8.5 μm to 11.5 μm and the thickness is 17 nm.

The production of PVD aluminum particles is, for example, described in Peter Wissling et al, Metalleffekt-Pigmente, Herausgeber, U. Zorll, Vincentz Verlag 2005, pages 53-63. Thickness of the particles is controlled during production by optical methods. During deposition the optical density of the deposited particles is measured, so that thickness can be adjusted with high accuracy. PVD aluminum particles for various applications are, for example, commercially available from BASF SE under the tradename Metasheen®.

The production of PVD flakes is well known in the art. For example, WO0024946 discloses a process for making flakes comprising: providing a vapor deposition chamber; placing a transport device in the vapor deposition chamber; providing a release coat source and a vacuum deposition source in the vacuum deposition chamber directed toward the transport device, in which the deposition source deposits a layer of flake material; applying a vacuum to the chamber, and while the chamber is evacuated, applying-alternate layers of a release coat from the release coat source and a vapor deposited flake layer from the vacuum deposition source to the transport device in sequence to build up a multi-layer sandwich of alternating flake material layers and intervening release coat layers, the release coat layers comprising a dissolvable material that forms a smooth continuous barrier layer and support surface on which the flake material layers can be formed, so that removal of the sandwich from the evacuated chamber yields a multi-layer sandwich which can be easily separated into flakes of fine particle size by subsequent treatment with a material that essentially completely dissolves the intervening release coat layers to remove them from the flakes.

According to WO0024946 another process for making metal flakes is a process of Avery Dennison Corporation for making flakes sold under the designation Metalure®. In this process both sides of a polyester carrier are gravure coated with a solvent-based resin solution. The dried coated web is then transported to a metallizing facility where both sides of the coated sheet are metallized by a thin film of vapor deposited aluminum. The sheet with the thin metal film is then returned to the coating facility where both sides of the aluminum are coated with a second film of the solvent-based resin solution. The dried coated/metal sheet is then transported again to the metallizing facility to apply a second film of vapor deposited aluminum to both sides of the sheet. The resulting multi-layer sheet is then transported for further processing to a facility where the coatings are stripped from the carrier in a solvent such as acetone. The stripping operation breaks the continuous layer into particles contained in a slurry. The solvent dissolves the polymer out from between the metal layers in the slurry. The slurry is then subjected to sonic treatment and centrifuging to remove the solvent and the dissolved coating, leaving a cake of concentrated aluminum flakes approximately 65% solids. The cake is then let down in a suitable vehicle and further sized by homogenizing into flakes of controlled size for use in inks, paints, and coatings. Metal flakes produced by this process for use in printable applications such as inks are characterized by a particle size from about 4 to 12 μm and a thickness from about 15 to about 25 nm.

The mean particle diameter D50 is in the range of 8 to 14.5 μm as measured by a laser diffraction instrument (Coulter LS130 l.a.s.e.r. diffraction granulometer).

The coating/printing compositions comprise the aluminum flakes as described above and a binder. The ratio of pigment to binder is sufficiently high as to permit the alignment of the pigment particles.

To accomplish this alignment of metal pigment flakes the coating/printing composition preferably has a very low binder, a low pigment content and a medium pigment to binder ratio.

The coating composition preferably comprises low solids, high viscosity binders. Preferably, the pigment to binder ratio is in the range of 3:1 to 1:3 by weight. For example, the pigment to binder ratio is by weight in the range of 1.5:1 to 1:1. In another specific embodiment the pigment to binder ratio is 3:1 by weight.

The binder is a high-molecular-weight organic compound conventionally used in coating compositions. The high molecular weight organic material may be of natural or synthetic origin. High molecular weight organic materials usually have molecular weights of about from $10^3$ to $10^8$ g/mol or even more. They may be, for example, natural resins, drying oils, rubber or casein, or natural substances derived therefrom, such as chlorinated rubber, oil-modified alkyd resins, viscose, cellulose ethers or esters, such as ethylcellulose, cellulose acetate, cellulose propionate, cellulose acetobutyrate or nitrocellulose, but especially totally synthetic organic polymers (thermosetting plastics and thermoplastics), as are obtained by polymerisation, polycondensation or polyaddition. From the class of the polymerisation resins there may be mentioned, especially, polyolefins, such as polyethylene, polypropylene or polyisobutylene, and also substituted polyolefins, such as polymerisation products of vinyl chloride, vinyl acetate, styrene, acrylonitrile, acrylic acid esters, methacrylic acid esters or butadiene, and also copolymerisation products of the said monomers, such as especially ABS or EVA.

Advantageously, the coating/printing composition further comprises a solvent.

The binder may comprise any one or more selected from the group comprising nitrocellulose, ethyl cellulose, cellulose acetate, cellulose acetate propionate (CAP), cellulose acetate butyrate (CAB), alcohol soluble propionate (ASP), vinyl chloride, vinyl acetate copolymers, vinyl acetate, vinyl, acrylic, polyurethane, polyamide, rosin ester, hydrocarbon, aldehyde, ketone, urethane, polyethyleneterephthalate, terpene phenol, polyolefin, silicone, cellulose, polyamide, polyester and rosin ester resins.

The coating composition is preferably a printing ink. The ink according to the present invention comprises, as in the case of an ordinary printing ink, the aluminum pigment, a binder, an auxiliary agent, and the like.

With respect to the binder resin, a thermoplastic resin may be used, examples of which include, polyethylene based polymers [polyethylene (PE), ethylene-vinyl acetate copolymer (EVA), vinyl chloride-vinyl acetate copolymer, vinyl alcohol-vinyl acetate copolymer, polypropylene (PP), vinyl based polymers [poly(vinyl chloride) (PVC), poly(vinyl butyral) (PVB), poly(vinyl alcohol) (PVA), poly(vinylidene chloride) (PVdC), poly(vinyl acetate) (PVAc), poly(vinyl formal) (PVF)], polystyrene based polymers [polystyrene (PS), styrene-acrylonitrile copolymer (AS), acrylonitrile-butadiene-styrene copolymer (ABS)], acrylic based polymers [poly(methyl methacrylate) (PMMA), MMA-styrene copolymer], polycarbonate (PC), celluloses [ethyl cellulose (EC), cellulose acetate (CA), propyl cellulose (CP), cellulose acetate butyrate (CAB), cellulose nitrate (CN)], fluorin based polymers [polychlorofluoroethylene (PCTFE), polytetrafluoroethylene (PTFE), tetrafluoroethylene-hexafluoroethylene copolymer (FEP), poly(vinylidene fluoride) (PVdF)], urethane based polymers (PU), nylons [type 6, type 66, type 610, type 11], polyesters (alkyl) [polyethylene terephthalate (PET), polybutylene terephthalate (PBT), polycyclohexane terephthalate (PCT)], novolac type phenolic resins, or the like. In addition, thermosetting resins such as resol type phenolic resin, a urea resin, a melamine resin, a polyurethane resin, an epoxy resin, an unsaturated polyester and the like, and natural resins such as protein, gum, shellac, copal, starch and rosin may also be used.

Furthermore, to the binder, a plasticizer for stabilizing the flexibility and strength of the print film and a solvent for adjusting the viscosity and drying property thereof may be added according to the needs therefor. The solvent may comprise any one or more of an ester, such as n-propyl acetate, iso-propyl acetate, ethyl acetate, butyl acetate; an alcohol, such as ethyl alcohol, industrial methylated spirits, isopropyl alcohol or normal propyl alcohol; a ketone, such as methyl ethyl ketone or acetone; an aromatic hydrocarbon, such as xylene and toluene. A solvent of a low boiling temperature of about 100° C. and a petroleum solvent of a high boiling temperature of 250° C. or higher, may be used according to the type of the printing method. An alkylbenzene or the like, for example may be used as a solvent of a low boiling temperature. Examples of solvents are ethoxypropanol, methylethylketon, methoxypropylacetate, diacetonalcohol etc.

Further in addition, an auxiliary agent including a variety of reactive agents for improving drying property, viscosity, and dispersibility, may suitably be added. The auxiliary agents are to adjust the performance of the ink, and for example, a compound that improves the abrasion resistance of the ink surface and a drying agent that accelerates the drying of the ink, and the like may be employed.

The ink comprises a total content of aluminum pigment of from 0.1 to 20% by weight, preferably 0.1-10% by weight based on the total weight of the ink.

Preferably, the binder comprises 15% nitrocellulose in conjunction with any above mentioned resin.

The composition may additionally comprise a solvent. The solvent may be ester/alcohol blends and preferably normal propyl acetate and ethanol. More preferably, the ester/alcohol blend is in a ratio of between 10:1 and 40:1, even more preferably 20:1 to 30:1.

The dried metallic ink has a thickness of from 0.6 μm to 10 μm.

The solvent used in the metallic ink may comprise any one or more of an ester, such as n-propyl acetate, iso-propyl acetate, ethyl acetate, butyl acetate; an alcohol, such as ethyl alcohol, industrial methylated spirits, isopropyl alcohol or normal propyl alcohol; a ketone, such as methyl ethyl ketone or acetone; an aromatic hydrocarbon, such as toluene, and water.

A UV-curable resin or an electron beam curable resin wherein a solvent is not used may also be employed as an alternative binder resin. The examples thereof include an acrylic resin, and specific examples of acrylic monomers as outlined above for the UV-curable composition.

The metallic ink may be applied to the coated substrate by means of conventional printing press such as gravure, rotogravure, flexographic, lithographic, offset, letterpress intaglio and/or screen process, or other printing processes, like for example ink jet printing. The coated substrate may then be rewound for further subsequent off line printing at a later stage or alternatively, the substrate may be pre-printed in line or off line or subsequently printed in line.

The metallic ink may comprise metal pigment particles, a binder and optionally a colorant, such as a pigment, or dye, functional pigments and/or dyes wherein pigments and dyes, which can be used for coloring the UV varnish, can also be used for colouring the metal-based ink.

Applying the method according to the invention results in a gloss value, as measured under a 20° geometry, higher than 500 relative gloss units.

Gloss measurements are well known measurements in the coatings and printing industry and are, for example, carried out with a Hunter or Zehnter ZGM 1120 gloss meter according to ISO 2813; in this case with a 20° geometry.

It is important to note, that the UV-coated paper or board must have a smooth flat surface without any optical structure, in order to achieve the high gloss values which are desired for packaging and decorative purposes.

In a specific embodiment of the invention the paper or board has been treated with a cationic polymer on the frontside before applying a curable composition (varnish) to at least a portion of the frontside of the paper substrate.

Treating in the context of the instant invention comprises all suitable means for applying the polymer solution to the surface of the paper substrate; in particular printing or coating.

The cationic polymers utilized in the present invention for treating the paper include repeating amine units that are capable of forming cationic amine salts. The amine group-containing cationic polymer may be a homopolymer or a copolymer. The homopolymer or copolymer may be either in the base form, or partially, or wholly, in the cationic amine salt form. Such cationic polymers are, for example, described in US 2008/0318150 on page 3 to 4.

Preferably the cationic polymer is a polyvinylamine, which is preferably hydrolysed to at least 90%.

Polyvinylamine or partially or fully hydrolysed polyvinylformamide are obtainable by polymerisation of N-vinylformamide and subsequent hydrolysis and elimination of the formyl groups to obtain amine groups. The degree of hydrolysis may range from 1% to 100%, preferably 50% and more preferably 90%. Particularly preferred is a fully hydrolysed poylvinylformamide.

The preparation of N-vinylformamide polymers and the subsequent hydrolysis is, for example, extensively described in U.S. Pat. No. 6,132,558, col. 2, line 36 to col. 5, line 25. Polyvinylamine and partially or fully hydrolysed polyvinylformamide are commercially available under the trade names Catiofast® and Polymin® from BASF SE.

For example the mean molecular weight of these polymers Mw is from 20 000 to 2 000 000 g/mol, for instance from 50 000 to 1 000 000, in particular from 100 000 to 500 000 g/mol.

For example the polyvinylamine contains 0.1 to 22 milliequivalent (meq), for instance 5 bis 18 meq cationic groups per gram polyvinylamine. The polyvinylamine polymers are typically in the form of a dispersion or solution, for example with a solid content from 10% to 40%, for instance from 15% to 30% and preferably from 20% to 25%. They are usually applied to the paper or board from such solutions or dispersions.

The amount applied of the above mentioned polymer solution is, for example 2 to 20 g, for instance 2 to 15 g and preferably 4 to 12 g per m² paper substrate. The polymer solution is subsequently dried by means of an infra red dryer and/or a hot air dryer.

It is also possible to apply together with the cationic polymer further natural polymers such as starch, in particular amylopectine. The amount admixed to the cationic polymer is typically from 5% to 50% based on the weight of the cationic polymer.

Further aspects of the invention are a paper product obtainable using the method as described above, and the use of the paper product for decorative or packaging purposes.

The paper product obtained with the instant method can additionally be overprinted with a UV varnish or with an acrylic waterbased varnish as an overlay varnish.

Preferences and definitions apply equally for all aspects of the invention.

The following examples illustrate the invention. All % values are % by weight; all ratios are weight ratios, unless otherwise specified.

EXAMPLE 1: PRINTING UV AND METAL INK ON CARD BOARD BY GRAVURE

Substrate: White board, Invercote T 220 g/m², 275 µm (high quality coated paper, Iggesund Paperboard Europe). The printing side is fully coated and finished to a matt level. Surface roughness 1.1 µm The composition of the UV lacquer is shown below:

| UV lacquer | % by weight |
| --- | --- |
| Tripropylene glycol diacrylate (TPGDA) | 1-25 |
| Dipropylene glycol diacrylate (DPGDA) | 30-45 |
| Ethoxylated trimethylol propane triacrylate (TMEOPTA) | 10-50 |
| Reactive tertiary amine | 1-15 |
| Photoinitiator blend | 5-9 |

Photoinitiator blend

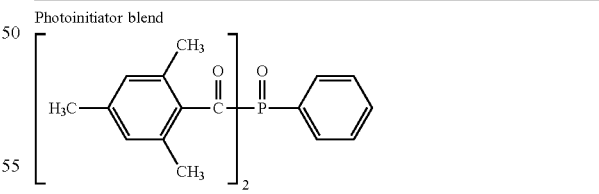

Bis(2,4,6-trimethylbenzoyl)-phenylphosphine oxide

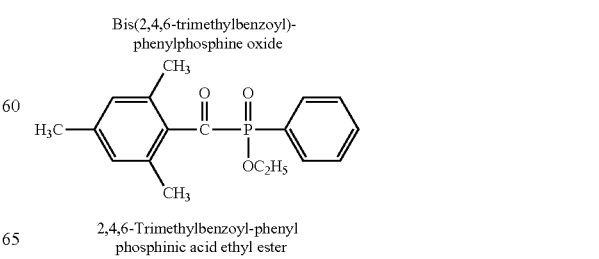

2,4,6-Trimethylbenzoyl-phenyl phosphinic acid ethyl ester

Nitrocellulose Varnish

Varnish preparation: 75.3 g of nitrocellulose (DHX 3/5 IPA, 70% solids, Nobel Enterprises, UK) are slowly added to 220.5 g of ethyl acetate (99-100% rein, Brenntag), 557.2 g n-Propylacetate, 147 g Dowanol PM in a 2000 mL glass bottle and gently stirred until complete dissolution at room temperature. Solid content measurements are then performed and quantity of ethyl acetate is adjusted to achieve a value of 5.27% solid content in the varnish preparation.

Al-Pigment Slurry (Supplied by BASF SE Under the Trade Name Metasheen®)

10% aluminum pigment+45% ethylacetate+45% isopropylacetate.

Metallic Ink 1 (D50, 8.5-11.5 µm, Thickness 17 nm)

Procedure for metallic ink preparation: aluminum pigment slurry is added to the above nitrocellulose varnish in such a proportion as to adjust the pigment to binder ratio to 1:1, ethylacetate is added to adjust ink to print viscosity (20 sec Zahn cup 2). The obtained dispersion is stirred with a Dispermat at 800 rpm for 10 minutes.

Metallic Ink 2 (D50, 8.0-12.0 µm, Thickness 13 nm):

Procedure for metallic ink preparation: aluminum pigment slurry is added to above nitrocellulose varnish in such a proportion as to adjust the pigment to binder ratio to 3:1; ethylacetate is added to adjust ink to print viscosity (20 sec Zahn cup 2). The obtained dispersion is stirred with a Dispermat at 800 rpm for 10 minutes.

Substrate: White board, Invercote T 220 g/m², 275 µm m (high quality coated paper, Iggesund Paperboard Europe). The printing side is fully coated and finished to a matt level. Surface roughness 1.1 µm.

UV-laquer and metallic ink are applied with Moser press comprising a UV gravure unit machine and a solvent gravure printing unit in-line.

Printing speed 30 m/min, UV curing intensity 50 Watt/cm², solvent ink drying temperature 80° C., UV gravure cylinder 30 l/cm screen, solvent ink gravure cylinder 120 l/cm screen. The results are given in Table 1.

TABLE 1

Gloss of the printed samples is measured by means of a Zehnter Glossmeter ZGM 1120 at 20° angle

| | Print | | | | |
|---|---|---|---|---|---|
| | Invercote T as delivered | Metal ink 1 | Metal ink 2 | UV varnish | UV and metal ink 1 | UV and metal ink 2 |
| Gloss units (GU) | 8 | 10 | 20 | 90 | 510 | 820 |

EXAMPLE 2

Substrate: Raflabrite RH1 85 g/m², 71 min (Multipurpose label paper for high quality multi-colour labels requiring good print definition and fine detail, UPM Raflatac). Roughness 0.7 µm.

The inks and the print process are the same as in Example 1.

Gloss of the printed samples is measured by means of a Zehnter Glossmeter ZGM 1120 at 20° angle. The results are given in Table 2.

TABLE 2

Gloss of metallic ink on paper and board is considerably increased when printing UV varnish first and overprinting a metallic ink containing fine grade aluminium pigment.

| | Print | | | | |
|---|---|---|---|---|---|
| | Raflabrite RH1 | Metal ink 1 | Metal ink 2 | UV varnish | UV and metal ink 1 | UV and metal ink 2 |
| Gloss units (GU) | 8 | 70 | 90 | 70 | 530 | 640 |

EXAMPLE 3

Gloss comparison of different aluminum pigment grades on UV coated and uncoated board.

The UV-laquer and the metallic inks are prepared as described in Example 1. Table 3 summarizes the different metallic inks.

TABLE 3

| Product | D50 | Thickness |
|---|---|---|
| Ink 1 | 8.5-11.5 µm | 17 nm |
| Ink 2 | 8.0-12.0 µm | 13 nm |
| Ink 3 | 11.0-13.0 µm | 25 nm |
| Ink 4 | 11.5-14.5 µm | 32 nm |

Application Procedure:

Paper is coated with metal ink using a wire bar 1 and dried with an air dryer.

UV varnish is coated on Invercote T board using wire bar 2 (12 micron). UV coated paper is cured under UV light (Aktiprint mini 18-2, mercury tube power 80 watt/cm, position 10) and overcoated with metal ink 1 using a wire bar 1 (6 micron wet film thickness) and dried with an air dryer.

Substrate: White Invercote T 220 g/m², 275 µm (High quality coated paper, Iggesund Paperboard Europe). The printing side is fully coated and finished to a matt level. Surface roughness is 1.1 µm. The results are presented in Table 4.

TABLE 4

Gloss of the samples is measured using a Zehnter Glossmeter ZGM 1120 at 20° angle

| Ink no./ Gloss units | 1 | 2 | 3 | 4 |
|---|---|---|---|---|
| Metal ink on board | 24 | 20 | 20 | 20 |
| UV varnish and metal ink on board | 1030 | 900 | 690 | 670 |

The samples coated with the UV varnish and overcoated with the metallic inks exhibit a far higher gloss value in all cases. The best values are achieved with ink no 1 and no 2.

EXAMPLE 4: GLOSS COMPARISON OF RADIATION CURING RESINS ON PAPER

Test procedure: UV varnish is manufactured by adding 5 parts by weight Irgacure 1173®, BASF to 95 parts by weight resin. The UV varnish is coated on Invercote T board using wire bar 0 (4 micron), 1 (6 micron), 2 (12 micron), 3 (24 micron). Coated paper is cured under UV light (Aktiprint mini 18-2, mercury tube, position 20) and overcoated with metal ink 1 using wire bar 1 (6 micron wet film thickness). The results are presented in Table 5.

TABLE 5

Gloss of the samples is measured using a Zehnter Glossmeter ZGM 1120 at 20° angle

| UV varnish | Gloss Units | Composition |
|---|---|---|
| Laromer PO 43F (ethoxylated oligo ether acrylate) | 525 | 80% TMPEOTA + 20% DGEBA diacrylate (CAS 28961-43-5 + 55818-57-0) |
| Laromer LR8863 (ethoxylated oligo ether acrylate) | 350 | 100% TMPEOTA (CAS 28961-43-5) |
| Laromer PO77F (ethoxylated amine modified polyether acrylate) | 615 | Ethoxylated amine modified polyether acrylate |
| Laromer LR8765 (aliphatic epoxy acrylate) | 550 | 1,4-butanediylbis[oxy(2-hydroxy-3,1-propanediyl)] diacrylate (CAS 52408-42-1) |
| Laromer LR8986 (modified aromatic epoxy acrylate) | 700 | 40% TMPEOTA + 60% DGEBA diacrylate (CAS 28961-43-5 + 55818-57-0) |
| Ebecryl 605 (epoxy acrylate) | 690 | 75% Bisphenol A Diglycidylether Diacrylat (BADGE-DA) + 25% TPGDA (CAS 55818-57-0 + 42978-66-5) |
| Laromer UA9073 (aromatic urethane acrylate) | 210 | 50% Urethane acrylate + 50% DPGDA (CAS 57472-68-1) |
| Laromer PE9024 (Polyester acrylate) | 330 | Polyester acrylate |
| Laromer DPGDA | 33 | Oxybis(methyl-2,1-ethanediyl) diacrylate CAS 57472-68-1 |

EXAMPLE 5: ROUGHNESS OF UV COATING AT DIFFERENT THICKNESSES

UV varnish 1: 37% Laromer DPGDA, 24% Laromer LR8863, 23% Laromer 8986, 10% Ebecryl P115, 3% Irgacure 127, 3% Irgacure 819

UV varnish 2: 46% Laromer LR8986, 36% Laromer PO77F, 14% Laromer TPGDA, 4% Irgacure 127

Metal Ink 1:

Nitrocellulose varnish as prepared in Example 1 with aluminum particles of ink 2 (D50, 8.0-12.0 μm, thickness 13 nm).

Susbtrate: White Invercote T 220 g/m², 275 μm (High quality coated paper, Iggesund Paperboard Europe). Surface roughness 1.1 μm Surface texture or roughness of UV-coated papers is measured by digital microscope holography (DHM) using a magnification×5 objective lens in the $1^{st}$-WL mode. The surface area measured is 1 mm×1 mm.

Sz values indicated in the table are the average distance of largest height (peak) and largest depth (whole) value found in the profile in nanometer. The results are given in Table 6.

TABLE 6

| | Sz values | | | |
|---|---|---|---|---|
| | UV coating thickness and roughness (nm) | | | |
| | 4 micron | 6 micron | 12 micron | 24 micron |
| UV varnish 1 and metal ink 1 | 220 | 235 | 230 | 270 |

TABLE 6-continued

| | Sz values | | | |
|---|---|---|---|---|
| | UV coating thickness and roughness (nm) | | | |
| | 4 micron | 6 micron | 12 micron | 24 micron |
| UV varnish 2 and metal ink 1 | 290 | 300 | 290 | 300 |

Invercote T board surface roughness, sz value: 620 nm

Invercote T coated with 6 micron wet film thickness metal ink 1, sz value: 795 nm Conclusion: The surface texture of Invercote T board is increased when directly coated with metal ink 1, the aluminum flakes are not flat oriented on the paper surface. The surface texture of the paper becomes smooth when coated with UV varnish and gloss increases considerably. The results correlate with gloss values as highest gloss and lowest roughness are measured with a UV coating thickness of 12 micron. The deposit of UV varnish on the paper surface leads to a smooth surface that enables the optimum orientation of aluminum flakes.

The invention claimed is:

1. A method for forming a smooth decorative surface coating exhibiting gloss on a paper or board substrate, the method comprising:
   A) applying a curable composition comprising one or more ethylenically unsaturated compounds and one or more photoinitiators to at least a portion of the frontside of the paper substrate by a process selected form the group consisting of gravure printing, flexographic printing, screen printing, coating with a slot coater, coating with a knife coater, coating with a wire bar and coating with a doctor blade;
   B) curing the composition by using a UV lamp; and
   C) printing an aluminium layer on the cured composition wherein the aluminium layer comprises a binder and vapour deposited aluminium particles with an mean diameter of from 8.0 μm to 12 μm and the thickness is from 11 to 18 nm, wherein said printing is a process selected from the group consisting of gravure printing, rotogravure printing, flexographic printing, lithographic printing, offset printing, letterpress intaglio printing, and screen printing, wherein the gloss, as measured under a 20° geometry has a value higher than 500 relative gloss units and the roughness of the coated paper ($S_z$ value) equal or below 300 nm.

2. The method according to claim 1, wherein the mean diameter of the vapor deposited aluminium particles is from 8.0 μm to 12 μm and the thickness is 13 nm.

3. The method according to claim 1, wherein the mean diameter of the vapor deposited aluminium particles is from 8.0 μm to 12 μm and the thickness is from 12 to 14 nm.

4. The method according to claim 1, wherein the paper or board substrate has a roughness of less than 1.5 μm.

5. The method according to claim 1, wherein the paper or board substrate has a weight of from 30 g/m2 to 300 g/m2.

6. The method according to claim 1, wherein the lamp is a gallium, or iron doped medium pressure mercury lamp.

7. The method according to claim 1, wherein the photoinitiator is selected from the group consisting of mono and bisacylphosphine oxide, alpha-hydroxy ketone, alpha-alkoxyketone, or alpha-aminoketone compounds and mixtures thereof.

8. The method according to claim 1, wherein the curable composition comprises an ethoxylated oligo ether acrylate, a polyester acrylate or an urethane acrylate.

9. The method according to claim 1, wherein the curable composition comprises an ethoxylated amine modified polyether acrylate or an epoxy acrylate.

10. The method according to claim 1, wherein the paper or board has been treated with a cationic polymer on the frontside before applying a curable composition to at least a portion of the frontside of the paper substrate.

11. The method according to claim 10, wherein the cationic polymer is a polyvinylamine.

12. A paper or board product obtained by the method according to claim 1.

13. A method, comprising employing the paper or board product of claim 12 for decorative or packaging purposes.

14. The method according to claim 1, wherein the curable composition comprises an ethoxylated oligo ether acrylate, an ethoxylated amine modified polyether acrylate, an epoxy acrylate, a polyester acrylate or an urethane acrylate.

15. The method according to claim 1, wherein the curable composition comprises 1 to 25 wt % tripropylene glycol diacrylate, 30 to 45 wt % dipropylene glycol diacrylate, 10 to 50 wt % ethoxylated trimethylol propane triacrylate, 1 to 15 wt % of a reactive tertiary amine, and 5 to 9 wt % of a photoinitiator.

16. The method according to claim 15, wherein the photoinitiator is a blend of Bis(2,4,6-trimethylbenzoyl)-phenylphosphine oxide and 2,4,6-Trimethylbenzoyl-phenyl phosphinic acid ethyl ester.

17. The method according to claim 1, wherein the coating comprises a pigment and a pigment to binder ratio ranging from 3:1 to 1:3.

18. The method according to claim 1, wherein the binder is nitrocellulose.

19. The method according to claim 1, wherein the curable composition further comprises a solvent.

20. The method according to claim 19, wherein the solvent is an ester/alcohol blend.

21. The method according to claim 19, wherein the solvent is a propyl acetate and ethanol blend.

* * * * *